United States Patent
Hsu et al.

(10) Patent No.: US 12,316,310 B2
(45) Date of Patent: May 27, 2025

(54) MULTI-CHANNEL SWITCH DEVICE

(71) Applicant: BRIGHT TOWARD INDUSTRIAL CO., LTD, New Taipei (TW)

(72) Inventors: Tzu-Hsu Hsu, New Taipei (TW); Wen-Cheng Lin, Taoyuan (TW)

(73) Assignee: BRIGHT TOWARD INDUSTRIAL CO., LTD, New Taipei (TW)

( * ) Notice: Subject to any disclaimer, the term of this patent is extended or adjusted under 35 U.S.C. 154(b) by 46 days.

(21) Appl. No.: 18/304,360

(22) Filed: Apr. 21, 2023

(65) Prior Publication Data

US 2024/0267045 A1 Aug. 8, 2024

(30) Foreign Application Priority Data

Feb. 2, 2023 (TW) .................................. 112200910

(51) Int. Cl.
*H03K 17/16* (2006.01)
*H03K 17/51* (2006.01)

(52) U.S. Cl.
CPC ..... *H03K 17/168* (2013.01); *H03K 2017/515* (2013.01)

(58) Field of Classification Search
None
See application file for complete search history.

(56) References Cited

U.S. PATENT DOCUMENTS

| | | | |
|---|---|---|---|
| 2011/0102022 A1* | 5/2011 | Lee | H03K 5/1534 327/74 |
| 2018/0343001 A1 | 11/2018 | Srirattana | |
| 2020/0351219 A1* | 11/2020 | Eliassi | H03K 17/002 |

OTHER PUBLICATIONS

"Search Report of Europe Counterpart Application", issued on Oct. 24, 2023, p. 1-p. 8.

* cited by examiner

*Primary Examiner* — Lincoln D Donovan
*Assistant Examiner* — James G Yeaman
(74) *Attorney, Agent, or Firm* — JCIPRNET

(57) ABSTRACT

A multi-channel switch device is provided. The multi-channel switch device includes a first-stage switch circuit, at least one second-stage switch circuit, and multiple third-stage switch circuits. The first-stage switch circuit includes a first common-mode node, a first input/output terminal, and at least one first-stage connection terminal. The second-stage switch circuit includes a second common-mode node, a second-stage transmission terminal, and multiple second-stage connection terminals. Each of the third-stage switch circuits includes a third common-mode node, a third-stage transmission terminal, a reference terminal, and a second input/output terminal. Two of the first input/output terminal and the at least one first-stage connection terminal are connected through the first common-mode node. Two of the second-stage transmission terminal and the second-stage connection terminals are connected through the second common-mode node. Two of the third-stage transmission terminal, the reference terminal, and the second input/output terminal are connected through the third common-mode node.

4 Claims, 6 Drawing Sheets

MULTI-CHANNEL SWITCH DEVICE

CROSS-REFERENCE TO RELATED APPLICATION

This application claims the priority benefit of Taiwan application Ser. No. 112200910, filed on Feb. 2, 2023. The entirety of the above-mentioned patent application is hereby incorporated by reference herein and made a part of this specification.

BACKGROUND

Technical Field

The disclosure relates to a switch device, and in particular to a multi-channel switch device.

Description of Related Art

Please refer to FIG. 1. FIG. 1 is a schematic diagram of a multi-channel switch device currently used for transmitting high frequency signals. A multi-channel switch device 10 includes switches 11-1 to 11-15 configured in multiple stages. The switch 11-1 is a first-stage switch. The switches 11-2 and 11-3 are respectively a second-stage switch. The switches 11-3 to 11-9 are respectively a third-stage switch. In addition, the switches 11-10 to 11-9 are respectively a fourth-stage switch. Among the first-stage switch, the switch 11-1 has connection terminals TN1, TR1, and TR2. The connection terminal TN1 is an input terminal. Among the second-stage switches, the switch 11-2 has connection terminals TN2 and TR3 to TR5. The switch 11-3 has connection terminals TN3 and TR6 to TR8.

Among the third-stage switch, the switch 11-4 has a reference terminal TG1 and connection terminals TN4 and TR9. The switch 11-5 has a reference terminal TG2 and connection terminals TN5 and TR10. Similarly, the switch 11-9 has a reference terminal TG6 and connection terminals TN9 and TR14. Among the fourth-stage switch, the switch 11-10 has a reference terminal TG7 and connection terminals TN10 and TR15. The switch 11-11 has a reference terminal TG8 and connection terminals TN11 and TR16. Similarly, the switch 11-15 has a reference terminal TG12 and connection terminals TN15 and TR20. The reference terminals TG1 to TG12 are respectively connected to a ground terminal through a load R. The connection terminals TN10 to TN15 are respectively an output terminal.

Generally speaking, the switches 11-1 to 11-15 are respectively a traditional single-contact switch. The switch 11-1 is selectively connected to one of the connection terminals TR1 and TR2 through the connection terminal TN1. The switch 11-2 is connected to one of the connection terminals TR3 to TR5 through the connection terminal TN2, and so on. Taking the switch 11-4 among the third-stage switches and the switch 11-10 among the fourth-stage switches as an example, when the multi-channel switch device 10 is operated to provide the resistance value of the load R from an input terminal RFIN, the connection terminal TN4 of the switch 11-4 is connected to the reference terminal TG1. When the multi-channel switch device 10 is operated to provide the resistance value of the load R from an output terminal (that is, the connection terminal TN10), the connection terminal TN10 of the switch 11-10 is connected to the reference terminal TG7. It can be seen that based on the design of the switches 11-1 to 11-15, when the multi-channel switch device 10 is operated to provide the resistance value of the load R from the input terminal RFIN, the multi-channel switch device 10 provides the resistance value of the load R using the third-stage switch. When the multi-channel switch device 10 is operated to provide the resistance value of the load R from the output terminal (that is, the connection terminal TN10), the multi-channel switch device 10 provides the resistance value of the load R using the fourth-stage switch. In other words, based on a branch transmission architecture, the multi-channel switch device 10 must be configured with multiple switch including at least four stages.

SUMMARY

The disclosure provides a multi-channel switch device having a small layout space.

A multi-channel switch device of the disclosure includes a first-stage switch circuit, at least one second-stage switch circuit, and multiple third-stage switch circuits. The first-stage switch circuit includes a first common-mode node, a first input/output terminal, and at least one first-stage connection terminal. The first input/output terminal receives or outputs a high frequency signal. Each of the at least one second-stage switch circuit includes a second common-mode node, a second-stage transmission terminal, and multiple second-stage connection terminals. The second-stage transmission terminal is coupled to a corresponding one of the at least one first-stage connection terminal. Each of the third-stage switch circuits includes a third common-mode node, a third-stage transmission terminal, a reference terminal, and a second input/output terminal. The third-stage transmission terminal is coupled to a corresponding one of the second-stage connection terminals. The reference terminal is coupled to a reference voltage through a load. The second input/output terminal outputs or receives the high frequency signal. Two of the first input/output terminal and the at least one first-stage connection terminal are connected through the first common-mode node. Two of the second-stage transmission terminal and the second-stage connection terminals are connected through the second common-mode node. Two of the third-stage transmission terminal, the reference terminal, and the second input/output terminal are connected through the third common-mode node.

In an embodiment of the disclosure, when a third-stage transmission terminal of a first switch circuit among the third-stage switch circuits is electrically connected to a second input/output terminal of the first switch circuit, second input/output terminals of the remaining third-stage switch circuits other than the first switch circuit are respectively electrically connected to reference terminals of the remaining third-stage switch circuits.

In an embodiment of the disclosure, the at least one first-stage connection terminal includes a first connection terminal. The first-stage switch circuit further includes a first switch and a second switch. The first switch is coupled between the first common-mode node and the first input/output terminal. The second switch is coupled between the first common-mode node and the first connection terminal of the first-stage switch circuit.

In an embodiment of the disclosure, the at least one first-stage connection terminal further includes a second connection terminal. The first-stage switch circuit further includes a third switch. The third switch is coupled between the first common-mode node and the second connection terminal of the first-stage switch circuit. Two of the first switch, the second switch, and the third switch are turned on.

In an embodiment of the disclosure, the at least one second-stage connection terminal includes a first connection terminal and a second connection terminal. Each of the at least one second-stage switch circuit further includes a first switch, a second switch, and a third switch. The first switch is coupled between the second common-mode node and the second-stage transmission terminal. The second switch is coupled between the second common-mode node and the first connection terminal. The third switch is coupled between the second common-mode node and the second connection terminal. Two of the first switch, the second switch, and the third switch are turned on.

In an embodiment of the disclosure, each of the at least one second-stage switch circuit further includes a measurement port and a fourth switch circuit. The fourth switch is coupled between the second common-mode node and the measurement port. Two of the first switch, the second switch, the third switch, and the fourth switch are turned on.

In an embodiment of the disclosure, the measurement port is detachably connected to an external instrument.

In an embodiment of the disclosure, each of the third-stage switch circuits includes a first switch, a second switch, and a third switch. The first switch is coupled between the third common-mode node and the second-stage transmission terminal. The second switch is coupled between the third common-mode node and the reference terminal. The third switch is coupled between the third common-mode node and the second input/output terminal. Two of the first switch, the second switch, and the third switch are turned on.

In an embodiment of the disclosure, at least one of the third-stage switch circuits further includes a measurement port and a fourth switch circuit. The fourth switch is coupled between the third common-mode node and the measurement port. Two of the first switch, the second switch, the third switch, and the fourth switch are turned on.

In an embodiment of the disclosure, the first-stage switch circuit, the at least one second-stage switch circuit, and the third-stage switch circuits are respectively implemented by one of a relay and a microelectromechanical multi-channel switch.

Based on the above, the multi-channel switch device of the disclosure includes the first-stage switch circuit, the at least one second-stage switch circuit, and the third-stage switch circuits. Therefore, compared with the current multi-channel switch device, the multi-channel switch device of the disclosure has a smaller layout space. In addition, in the first-stage switch circuit, two of the first input/output terminal and the at least one first-stage connection terminal are connected through the first common-mode node. In the second-stage switch circuit, two of the second-stage transmission terminal and the second-stage connection terminals are connected through the second common-mode node. In the third-stage switch circuit, two of the third-stage transmission terminal, the reference terminal, and the second input/output terminal are connected through the third common-mode node. Therefore, based on a branch transmission architecture, the multi-channel switch device of the disclosure only needs the three-stage switch circuits to be implemented. As a result, the multi-channel switch device has a small layout space.

DETAILED DESCRIPTION OF DISCLOSED EMBODIMENTS

Figure 1:
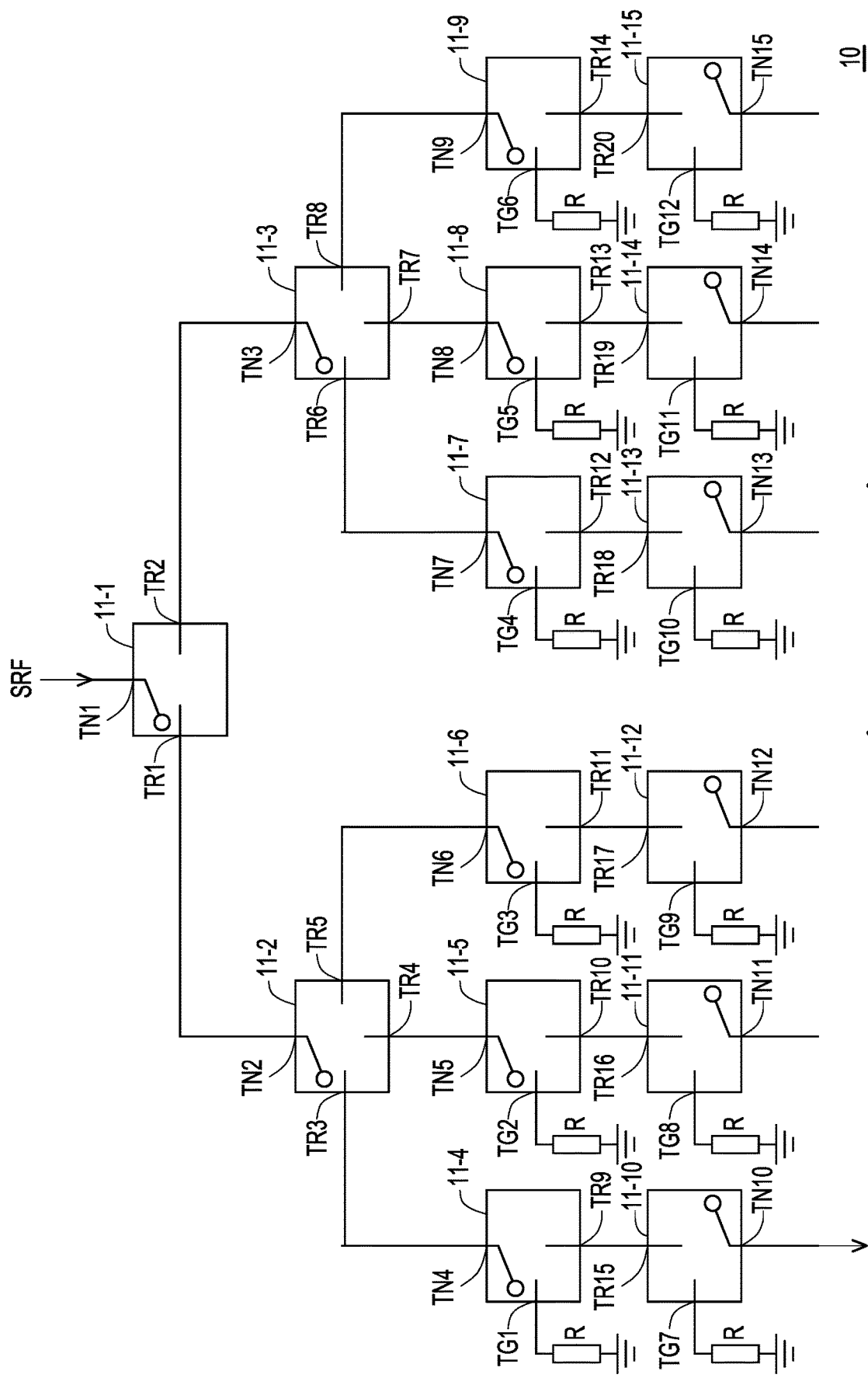
FIG. 1 is a schematic diagram of a multi-channel switch device currently used for transmitting high frequency signals.

Some embodiments of the disclosure will be described in detail below with reference to the drawings. For the reference numerals cited in the following description, when the same reference numerals appear in different drawings, the reference numerals will be regarded as referring to the same or similar elements. The embodiments are only a part of the disclosure and do not disclose all possible implementations of the disclosure. More specifically, the embodiments are merely examples in the claims of the disclosure.

Figure 2:
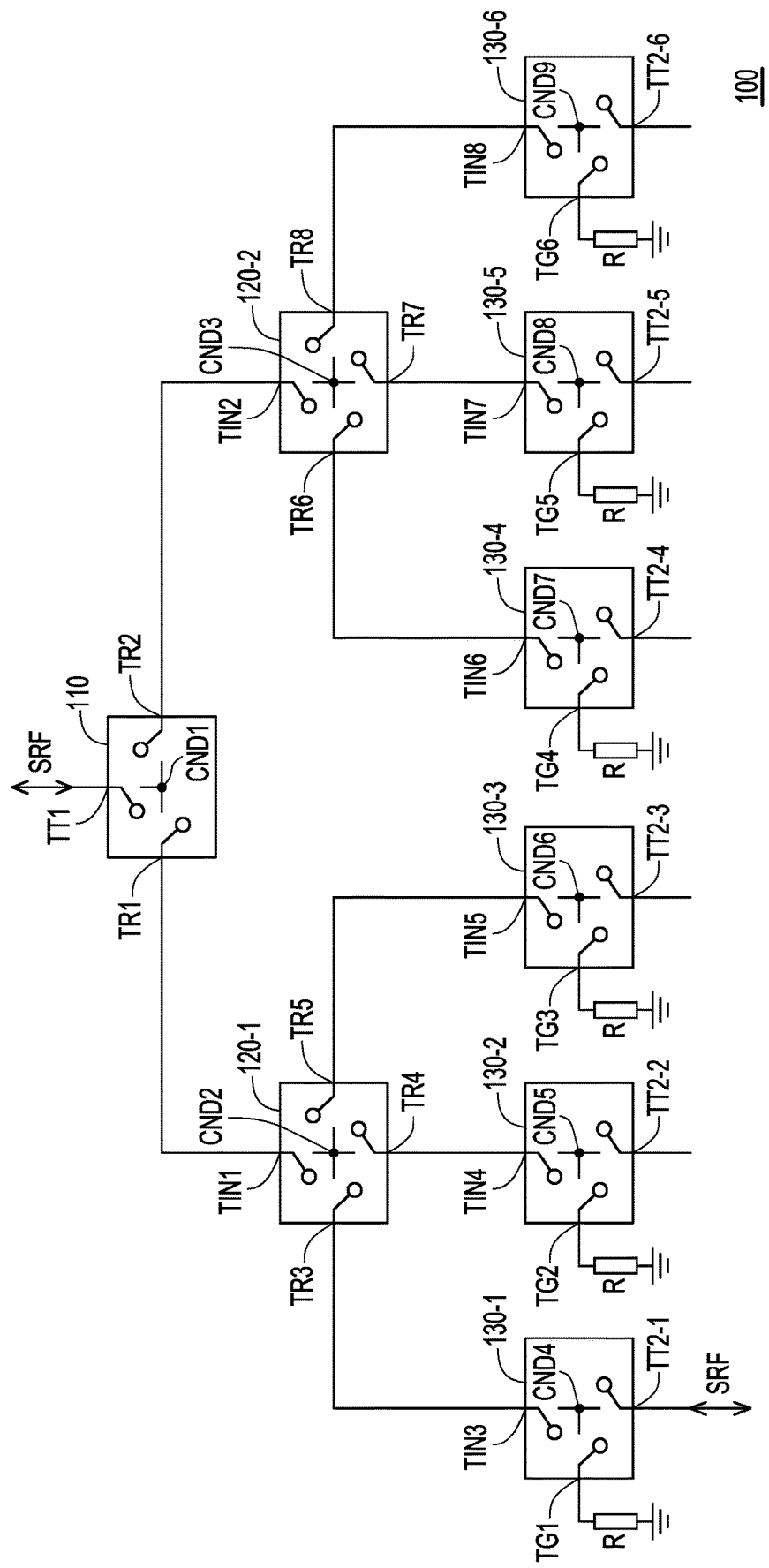
FIG. 2 is a schematic diagram of a multi-channel switch device according to an embodiment of the disclosure.

Please refer to FIG. 2. FIG. 2 is a schematic diagram of a multi-channel switch device according to an embodiment of the disclosure. In the embodiment, a multi-channel switch device 100 includes a switch circuit 110 (also referred to as a first-stage switch circuit 110), switch circuits 120-1 and 120-2 (also referred to as second-stage switch circuits 120-1 and 120-2), and switch circuits 130-1 to 130-6 (also referred to as third-stage switch circuits 130-1 to 130-6). The switch circuit 110 includes a common-mode node CND1, an input/output terminal TT1, and connection terminals TR1 and TR2 (also referred to as first-stage connection terminals TR1 and TR2). The input/output terminal TT1 is configured to receive or output a high frequency signal SRF.

The switch circuit 120-1 includes a common-mode node CND2, a second-stage transmission terminal TIN1, and connection terminals TR3 to TR5 (also referred to as second-stage connection terminals TR3 to TR5). The switch circuit 120-2 includes a common-mode node CND3, a second-stage transmission terminal TIN2, and connection terminals TR6 to TR8 (also referred to as second-stage connection terminals TR6 to TR8). In the embodiment, the second-stage transmission terminals TIN1 and TIN2 are coupled to corresponding ones of the connection terminals TR1 and TR2 of the first-stage switch circuit 110. For example, the second-stage transmission terminal TIN1 is coupled to the connection terminal TR1 of the first-stage switch circuit 110. The second-stage transmission terminal TIN2 is coupled to the connection terminal TR2 of the first-stage switch circuit 110.

The switch circuit 130-1 includes a common-mode node CND4, a third-stage transmission terminal TIN3, a reference terminal TG1, and an input/output terminal TT2-1. The switch circuit 130-2 includes a common-mode node CND5, a third-stage transmission terminal TIN4, a reference terminal TG2, and an input/output terminal TT2-2. Similarly, the switch circuit 130-6 includes a common-mode node CND9, a third-stage transmission terminal TIN8, a reference terminal TG6, and an input/output terminal TT2-6. In the embodiment, the third-stage transmission terminals TIN3 to TIN8 are coupled to corresponding ones of the connection terminals TR3 to TR8. For example, the third-stage transmission terminal TIN3 is coupled to the connection terminal TR3 of the second-stage switch circuit 120-1. The third-stage transmission terminal TIN4 is coupled to the connection terminal TR4 of the second-stage switch circuit 120-1, and so on. In the embodiment, the reference terminals TG1 to TG6 are respectively coupled to a reference voltage through a corresponding load R. The reference voltage may be a fixed bias voltage. The reference voltage is, for example, ground (the disclosure is not limited thereto). The input/output terminals TT2-1 to TT2-6 are respectively configured to output or receive the high frequency signal SRF.

In the embodiment, the load R may be a resistor. For example, the resistance value of the load R is designed to be 50 ohms.

In the embodiment, in the switch circuit 110, two of the input/output terminal TT1 and the connection terminals TR1 and TR2 are connected through the common-mode node CND1. In the switch circuit 120-1, two of the second-stage transmission terminal TIN1 and the connection terminals TR1 to TR5 are connected through the common-mode node CND2. In the switch circuit 120-2, two of the second-stage transmission terminal TIN2 and the connection terminals TR6 to TR8 are connected through the common-mode node CND3. In the switch circuit 130-1, two of the third-stage transmission terminal TIN3, the reference terminal TG1, and the input/output terminal TT2-1 are connected through the common-mode node CND4. In the switch circuit 130-2, two of the third-stage transmission terminal TIN4, the reference terminal TG2, and the input/output terminal TT2-2 are connected through the common-mode node CND5, and so on.

In the embodiment, taking the switch circuit 130-1 as an example, when the multi-channel switch device 100 is operated to provide the resistance value of the load R from the input/output terminal TT1, the switch circuit 130-1 connects the third-stage transmission terminal TIN3 to the common-mode node CND4, and connects the reference terminal TG1 to the common-mode node CND4. When the multi-channel switch device 100 is operated to provide the resistance value of the load R from the input/output terminal TT2-1, the switch circuit 130-1 connects the input/output terminal TT2-1 to the common-mode node CND4, and connects the reference terminal TG1 to the common-mode node CND4. In addition, when the multi-channel switch device 100 is operated to provide the high frequency signal SRF from the input/output terminal TT1 to the input/output terminal TT2-1, the switch circuit 130-1 connects the third-stage transmission terminal TIN3 to the common-mode node CND4, and connects the input/output terminal TT2-1 to the common-mode node CND4. It should be noted that the above operations may all be implemented by the three-stage switch circuits without an additional fourth-stage switch circuit.

Please refer to FIG. 1 and FIG. 2 at the same time. The switches 11-1 to 11-15 shown in FIG. 1 are respectively a single-contact switch. Limited by the configuration of the switches 11-1 to 11-15, the current multi-channel switch device 10 has the configuration of a fourth-stage switch circuit. The multi-channel switch device 100 of the embodiment only needs the configuration of the three-stage switch circuits. Therefore, the multi-channel switch device 100 has a smaller layout space.

Please return to the embodiment of FIG. 2. The switch circuits 110, 120-1, 120-2, and 130-1 to 130-6 are respectively implemented by one of a relay and a microelectromechanical (MEM) multi-channel switch. Therefore, compared with the single-contact switch adopted in the current technology, the switch circuits 110, 120-1, 120-2, and 130-1 to 130-6 respectively have smaller volumes.

In the embodiment, the multi-channel switch device 100 is exemplified by having two second-stage switch circuits and six third-stage switch circuits, but the disclosure is not limited thereto. The number of second-stage switch circuits of the disclosure may be one or more. The number of third-stage switch circuits of the disclosure may be multiple.

Figure 3:
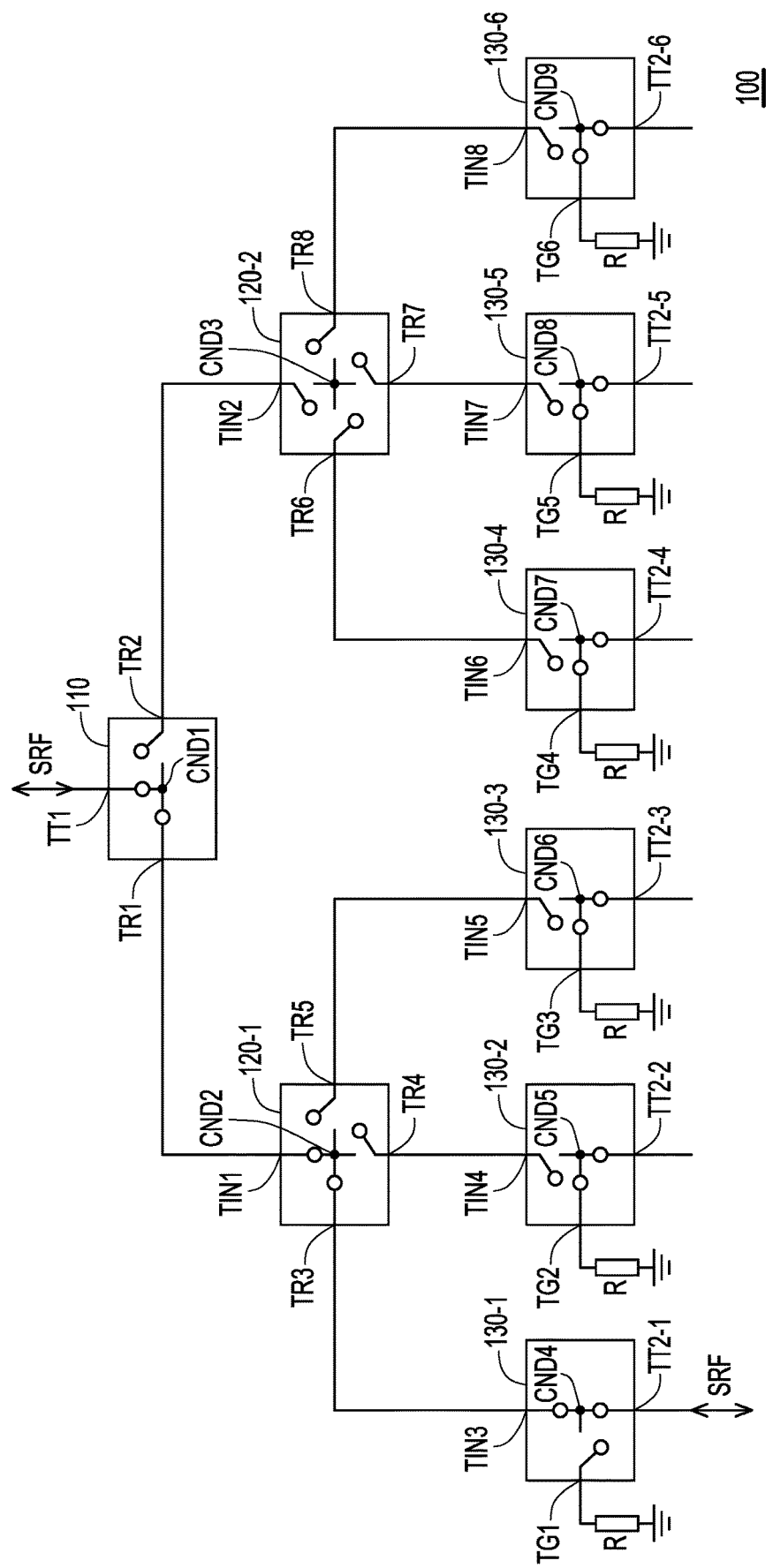
FIG. 3 is a schematic diagram of an operation of the multi-channel switch device shown in FIG. 2.

Please refer to FIG. 3. FIG. 3 is a schematic diagram of an operation of the multi-channel switch device shown in FIG. 2. In the embodiment, when the third-stage transmission terminal TIN3 of the switch circuit 130-1 is electrically connected to the input/output terminal TT2-1 of the switch circuit 130-1, the input/output terminals TT2-2 to TT2-6 of the switch circuits 130-2 to 130-6 are electrically connected to the reference terminals TG2 to TG6 of the switch circuits 130-2 to 130-6. Therefore, the multi-channel switch device 100 can perform interference isolation on the input/output terminals TT2-2 to TT2-6.

In the embodiment, the multi-channel switch device 100 can also provide a bidirectional signal transmission channel between any two terminals of the input/output terminals TT2-1 to TT2-2. For example, the connection terminal TR3 of the switch circuit 120-1 is operated to be connected to the connection terminal TR4 through the common-mode node CND2. The third-stage transmission terminal TIN3 of the switch circuit 130-1 is operated to be electrically connected to the input/output terminal TT2-1 of the switch circuit 130-1 through the common-mode node CND4. The third-stage transmission terminal TIN4 of the switch circuit 130-2 is operated to be electrically connected to the input/output terminal TT2-2 of the switch circuit 130-2 through the common-mode node CND5. Therefore, the multi-channel switch device 100 provides the bidirectional signal transmission channel between the input/output terminals TT2-1 and TT2-2. In the embodiment, the input/output terminals TT2-3 to TT2-6 of the switch circuits 130-3 to 130-6 are electrically connected to the reference terminals TG3 to TG6 of the switch circuits 130-3 to 130-6. Therefore, the multi-channel switch device 100 can perform interference isolation on the input/output terminals TT2-3 to TT2-6.

Figure 4:
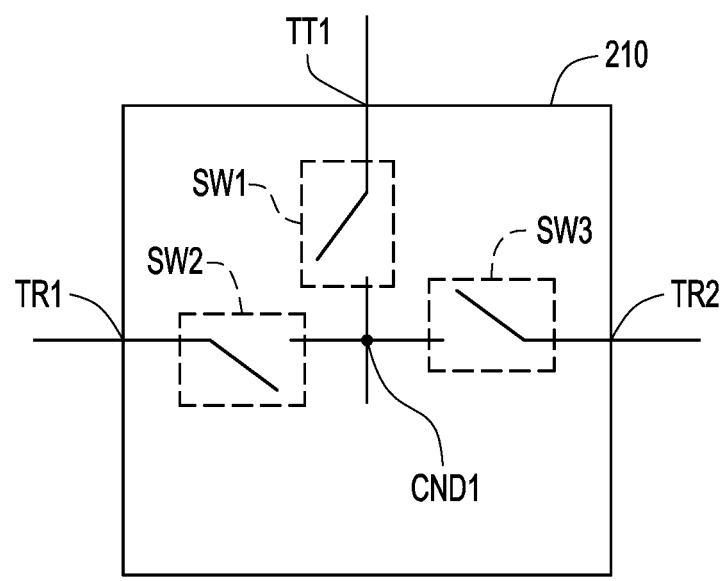
FIG. 4 is a schematic diagram of a first-stage switch circuit according to an embodiment of the disclosure.

Please refer to FIG. 4. FIG. 4 is a schematic diagram of a first-stage switch circuit according to an embodiment of the disclosure. In the embodiment, a switch circuit 210 includes the common-mode node CND1, the input/output terminal TT1, the connection terminals TR1 and TR2, and switches SW1 to SW3. The switch SW1 is coupled between the common-mode node CND1 and the input/output terminal TT1. The switch SW2 is coupled between the common-mode node CND1 and the connection terminal TR1. The switch SW3 is coupled between the CND1 and the connection terminal TR2. In the embodiment, in the switch circuit 210, two of the switches SW1 to SW3 are turned on.

In the embodiment, the switches SW1 to SW3 may be respectively implemented by a transistor switch in a transistor relay or a MEM arm of a MEM multi-channel switch, but the disclosure is not limited to the implementation of the switches SW1 to SW3.

Based on actual requirements, the number of connection terminals of the switch circuit 210 may be adjusted. Therefore, the number of switches is also correspondingly adjusted. The number of connection terminals of the switch circuit 210 may be one or more.

Figure 5:
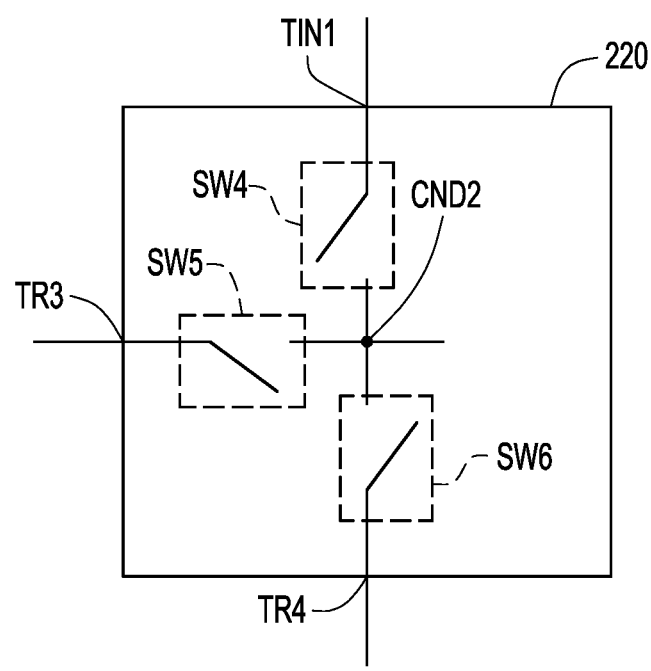
FIG. 5 is a schematic diagram of a second-stage switch circuit according to an embodiment of the disclosure.

Please refer to FIG. 5. FIG. 5 is a schematic diagram of a second-stage switch circuit according to an embodiment of the disclosure. In the embodiment, a switch circuit 220 includes the common-mode node CND2, the second-stage transmission terminal TIN1, the connection terminals TR3 and TR4, and switches SW4 to SW6. The switch SW4 is coupled between the common-mode node CND2 and the second-stage transmission terminal TIN1. The switch SW5 is coupled between the common-mode node CND2 and the connection terminal TR3. The switch SW6 is coupled between the common-mode node CND2 and the connection terminal TR4. In the switch circuit 220, two of the switches SW4 to SW6 are turned on.

Based on actual requirements, the number of connection terminals of the switch circuit 220 may be adjusted. Therefore, the number of switches is also correspondingly adjusted. The number of connection terminals of the switch circuit 220 may be more than one.

Figure 6:
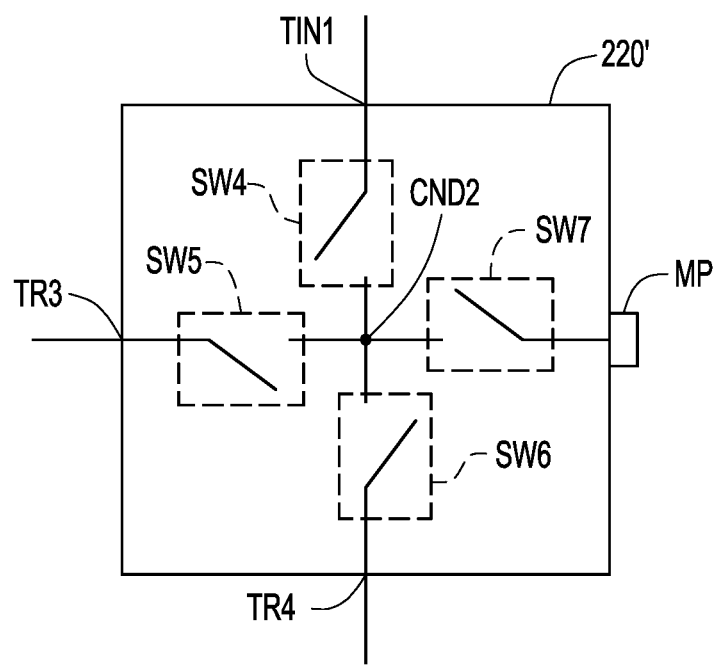
FIG. 6 is a schematic diagram of a second-stage switch circuit according to another embodiment of the disclosure.

Please refer to FIG. 6. FIG. 6 is a schematic diagram of a second-stage switch circuit according to another embodiment of the disclosure. In the embodiment, a switch circuit 220' includes the common-mode node CND2, the second-stage transmission terminal TIN1, the connection terminals TR3 and TR4, switches SW4 to SW7, and a measurement port MP. The switch SW4 is coupled between the common-mode node CND2 and the second-stage transmission terminal TIN1. The switch SW5 is coupled between the common-mode node CND2 and the connection terminal TR3. The switch SW6 is coupled between the common-mode node CND2 and the connection terminal TR4. The switch SW7 is coupled between the common-mode node CND2 and the measurement port MP. In the switch circuit 220', two of the switches SW4 to SW7 are turned on. In the embodiment, the measurement port MP is detachably connected to an external instrument. The measurement port MP may be a connection module known to persons skilled in the art, such as an SNA connector.

Figure 7:
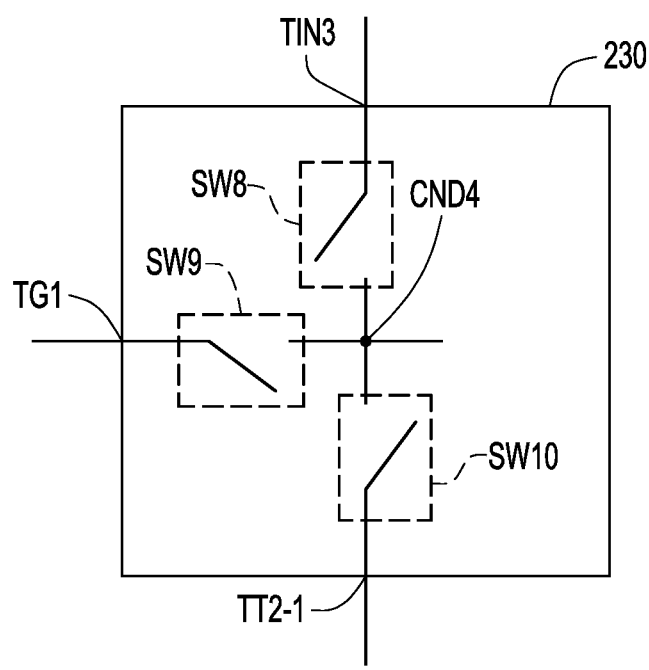
FIG. 7 is a schematic diagram of a third-stage switch circuit according to an embodiment of the disclosure.

Please refer to FIG. 7. FIG. 7 is a schematic diagram of a third-stage switch circuit according to an embodiment of the disclosure. In the embodiment, a switch circuit 230 includes the common-mode node CND4, the third-stage transmission terminal TIN3, the reference terminal TG1, the input/output terminal TT2-1, and switches SW8 to SW10. The switch SW8 is coupled between the common-mode node CND4 and the third-stage transmission terminal TIN3. The switch SW9 is coupled between the common-mode node CND4 and the reference terminal TG1. The switch SW10 is coupled between the common-mode node CND4 and the input/output terminal TT2-1. In the switch circuit 230, two of the switches SW8 to SW10 are turned on.

Based on actual requirements, the number of connection terminals of the switch circuit 230 may be adjusted. Therefore, the number of switches is also correspondingly adjusted. The number of connection terminals of the switch circuit 230 may be one or more.

Figure 8:
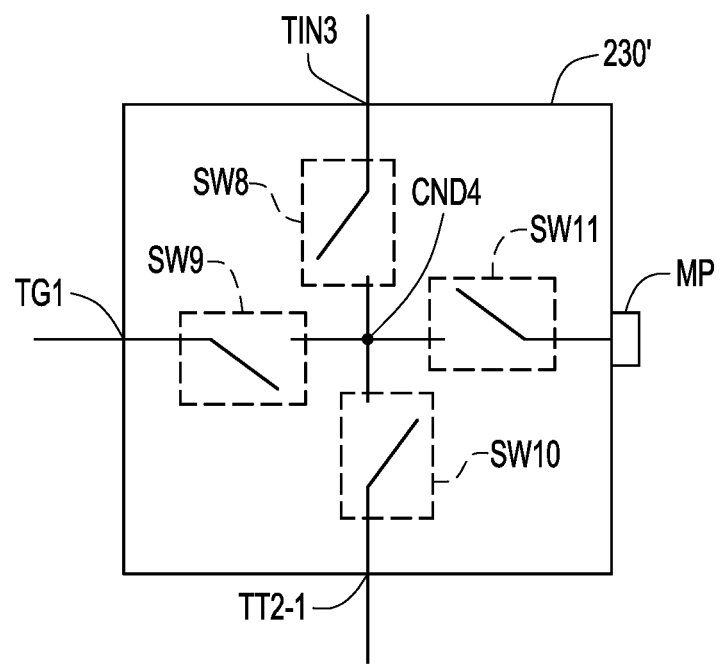
FIG. 8 is a schematic diagram of a third-stage switch circuit according to another embodiment of the disclosure.

Please refer to FIG. 8. FIG. 8 is a schematic diagram of a third-stage switch circuit according to another embodiment of the disclosure. In the embodiment, a switch circuit 230' includes the common-mode node CND4, the third-stage transmission terminal TIN3, the reference terminal TG1, the input/output terminal TT2-1, switches SW8 to SW11, and the measurement port MP. The switch SW8 is coupled between the common-mode node CND4 and the third-stage transmission terminal TIN3. The switch SW9 is coupled between the common-mode node CND4 and the reference terminal TG1. The switch SW10 is coupled between the common-mode node CND4 and the input/output terminal TT2-1. The switch SW11 is coupled between the common-mode node CND4 and the measurement port MP. In the switch circuit 230', two of the switches SW8 to SW11 are turned on.

In summary, the multi-channel switch device of the disclosure includes the first-stage switch circuit, the at least one second-stage switch circuit, and the third-stage switch circuits. Therefore, compared with the current multi-channel switch device, the multi-channel switch device of the disclosure has a smaller layout space.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A multi-channel switch device, comprising:
   a first-stage switch circuit, comprising:
     a first common-mode node;
     a first input/output terminal, configured to receive or output a high frequency signal; and
     at least one first-stage connection terminal;
   at least one second-stage switch circuit, each comprising:
     a second common-mode node;
     a second-stage transmission terminal, coupled to a corresponding one of the at least one first-stage connection terminal; and
     a plurality of second-stage connection terminals;
   a plurality of third-stage switch circuits, each comprising:
     a third common-mode node;
     a third-stage transmission terminal, coupled to a corresponding one of the second-stage connection terminals;
     a reference terminal, coupled to a reference voltage through a load; and
     a second input/output terminal, configured to output or receive the high frequency signal,
   wherein two of the first input/output terminal and the at least one first-stage connection terminal are connected through the first common-mode node,
   wherein two of the second-stage transmission terminal and the second-stage connection terminals are connected through the second common-mode node,
   wherein two of the third-stage transmission terminal, the reference terminal, and the second input/output terminal are connected through the third common-mode node, and
   wherein when a third-stage transmission terminal of a first switch circuit among the third-stage switch circuits is electrically connected to a second input/output terminal of the first switch circuit, second input/output terminals of the remaining third-stage switch circuits other than the first switch circuit are respectively electrically connected to reference terminals of the remaining third-stage switch circuits.

2. The multi-channel switch device according to claim 1, wherein each of the third-stage switch circuits comprises:
   a first switch, coupled between the third common-mode node and the third-stage transmission terminal;
   a second switch, coupled between the third common-mode node and the reference terminal; and
   a third switch, coupled between the third common-mode node and the second input/output terminal,
   wherein two of the first switch, the second switch, and the third switch are turned on.

3. The multi-channel switch device according to claim 2, wherein at least one of the third-stage switch circuits further comprises:
- a measurement port; and
- a fourth switch, coupled between the third common-mode node and the measurement port,
- wherein two of the first switch, the second switch, the third switch, and the fourth switch are turned on.

4. The multi-channel switch device according to claim 1, wherein the first-stage switch circuit, the at least one second-stage switch circuit, and the third-stage switch circuits are respectively implemented by one of a relay and a micro-electromechanical multi-channel switch.

* * * * *